(12) United States Patent
Tsuchimochi (10) Patent No.: US 10,600,717 B2
(45) Date of Patent: Mar. 24, 2020

(54) SEMICONDUCTOR DEVICE

(71) Applicant: Toyota Jidosha Kabushiki Kaisha, Toyota-shi, Aichi-ken (JP)

(72) Inventor: Shingo Tsuchimochi, Nagakute (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 16/242,398

(22) Filed: Jan. 8, 2019

(65) Prior Publication Data
US 2019/0221496 A1 Jul. 18, 2019

(30) Foreign Application Priority Data

Jan. 17, 2018 (JP) .................................. 2018-005643

(51) Int. Cl.
*H01L 23/373* (2006.01)
*H01L 23/10* (2006.01)
(Continued)

(52) U.S. Cl.
CPC .......... *H01L 23/3735* (2013.01); *H01L 23/10* (2013.01); *H01L 23/31* (2013.01);
(Continued)

(58) Field of Classification Search
CPC ... H01L 23/10; H01L 23/367; H01L 23/3735; H01L 24/33; H01L 2924/01013; H01L 2924/01029; H01L 2924/3511
See application file for complete search history.

(56) References Cited

U.S. PATENT DOCUMENTS

2004/0183188 A1* 9/2004 Oohama ............. H01L 23/3107
257/706
2005/0230816 A1* 10/2005 Kurauchi ............ H01L 23/3107
257/706
(Continued)

FOREIGN PATENT DOCUMENTS

JP 4967447 B2 7/2012
JP 2012-146760 A 8/2012
WO 2012/096066 A1 7/2012

OTHER PUBLICATIONS

U.S. Appl. No. 16/146,340 filed Sep. 28, 2018.
(Continued)

*Primary Examiner* — Peniel M Gumedzoe
(74) *Attorney, Agent, or Firm* — Dinsmore & Shohl LLP (57) ABSTRACT

A semiconductor device includes a first semiconductor element, a first heat dissipation plate connected to the first semiconductor element, a sealing body that integrally holds the first semiconductor element and the first heat dissipation plate, and a first terminal that is electrically connected to the first semiconductor element and protrudes from the sealing body. The first heat dissipation plate has an insulating substrate, an inner conductor layer, and an outer conductor layer. The outer conductor layer is exposed on a first main surface of the sealing body. The first terminal protrudes from a first side surface adjacent to the first main surface of the sealing body. On the first main surface of the sealing body, at least one first groove extending in a direction along the first side surface is provided in a range located between the outer conductor layer and the first side surface.

20 Claims, 5 Drawing Sheets

(51) Int. Cl.
H01L 23/367 (2006.01)
H01L 23/00 (2006.01)
H01L 23/31 (2006.01)
H01L 23/433 (2006.01)

(52) U.S. Cl.
CPC ........ *H01L 23/367* (2013.01); *H01L 23/4334* (2013.01); *H01L 24/33* (2013.01); *H01L 2924/01013* (2013.01); *H01L 2924/01029* (2013.01); *H01L 2924/3511* (2013.01)

(56) References Cited

U.S. PATENT DOCUMENTS

| | | | | |
|---|---|---|---|---|
| 2006/0108700 | A1* | 5/2006 | Nakazawa | H01L 21/565 257/787 |
| 2007/0267739 | A1 | 11/2007 | Kajiwara et al. | |
| 2008/0029911 | A1* | 2/2008 | Jeon | H01L 23/3121 257/787 |
| 2013/0015468 | A1* | 1/2013 | Kikuchi | H01L 24/40 257/77 |
| 2014/0159216 | A1* | 6/2014 | Ishino | H01L 23/4006 257/675 |
| 2014/0327144 | A1* | 11/2014 | Yang | H01L 23/3135 257/762 |
| 2016/0381800 | A1* | 12/2016 | Yagnamurthy | B29C 69/001 365/51 |

OTHER PUBLICATIONS

Infineon power modules for hybrid and electric vehicles help meet space constraints and deliver higher power density, Market News, May 10, 2016, https://www.infineon.com/cms/en/about-infineon/press/market-news/2016/INFATV201605-056.html.

* cited by examiner

SEMICONDUCTOR DEVICE

CROSS-REFERENCE TO RELATED APPLICATIONS

This application claims priority to Japanese Patent Application No. 2018-005643 filed on Jan. 17, 2018, which is incorporated herein by reference in its entirely including the specification, drawings and abstract.

BACKGROUND

1. Technical Field

The disclosure relates to a semiconductor device.

2. Description of Related Art

Japanese Unexamined Patent Application Publication No. 2012-146760 (JP 2012-146760 A) discloses a semiconductor device. The semiconductor device includes a semiconductor element, a heat dissipation plate connected to the semiconductor element, a sealing body integrally holding the semiconductor element and the heat dissipation plate, and a terminal electrically connected to the semiconductor element and protruding from the sealing body. The heat dissipation plate has an insulating substrate, an inner conductor layer located on a first side of the insulating substrate and electrically connected to the semiconductor element, and an outer conductor layer located on a second side of the insulating substrate. The outer conductor layer is exposed on the main surface of the sealing body. The terminal protrudes from the side surface adjacent to the main surface of the sealing body.

SUMMARY

In general, the above-described semiconductor device is built into a semiconductor module together with a cooler, and the cooler is disposed adjacent to the heat dissipation plate. In such a semiconductor module, in order to obtain more effective cooling characteristics, it is desirable that the heat dissipation plate is adjacent to the cooler without a gap therebetween. For that purpose, it is desirable that the main surface of the sealing body from which the heat dissipation plate is exposed has an excellent flatness. However, the heat dissipation plate having the insulating substrate has a relatively small linear expansion coefficient, whereas the sealing body holding the heat dissipation plate has a relatively large linear expansion coefficient. For this reason, for example, in a temperature change in the step of molding the sealing body, uneven thermal expansion occurs between the heat dissipation plate and the sealing body. Accordingly, warping deformation may occur in the entire semiconductor device. In such a case, it is conceivable to increase the flatness of the main surface by cutting the main surface of the sealing body after molding the sealing body. However, even in a case where the main surface of the sealing body is cut at the time of manufacturing the semiconductor device, warping deformation occurring during use of the semiconductor device cannot be avoided. Therefore, the disclosure provides a semiconductor device capable of suppressing the occurrence of warping deformation.

An aspect of the disclosure relates to a semiconductor device including a first semiconductor element, a first heat dissipation plate, a sealing body, and a first terminal. The first heat dissipation plate is connected to the first semiconductor element. The sealing body integrally holds the first semiconductor element and the first heat dissipation plate. The first terminal is electrically connected to the first semiconductor element and protrudes from the sealing body. The first heat dissipation plate has a first insulating substrate, a first inner conductor layer, and a first outer conductor layer. The first inner conductor layer is located on a first side of the first insulating substrate and is electrically connected to the first semiconductor element. The first outer conductor layer is located on a second side of the first insulating substrate. The first outer conductor layer is exposed on a first main surface of the sealing body. The first terminal protrudes from a first side surface adjacent to the first main surface of the sealing body. On the first main surface of the sealing body, at least one first groove extending in a direction along the first side surface is provided in a range located between the first outer conductor layer and the first side surface.

In the semiconductor device, the first terminal protruding from the first side surface of the sealing body extends toward the first heat dissipation plate in the sealing body. In a range where the first terminal extends, the first heat dissipation plate is not present. Accordingly, most of the range where the first terminal extends is formed by the sealing body. For this reason, the amount of deformation due to a temperature change in the range where the first terminal extends is larger than that in the other range where the first heat dissipation plate is present. In this respect, on the first main surface of the sealing body in the semiconductor device according to the aspect of the disclosure, at least one first groove extending in a direction along the first side surface is provided in a range located between the first outer conductor layer and the first side surface. According to such a configuration, in the above-described range where the first terminal extends, thermal deformation or thermal stress caused by the thermal deformation is reduced by the first groove provided on the first main surface. As a result, it is possible to suppress warping deformation occurring in the semiconductor device.

In the semiconductor device according to the aspect of the disclosure, the at least one first groove may include a plurality of first grooves, and a groove located closer to the first side surface among the first grooves may have a larger depth.

The semiconductor device according to the aspect of the disclosure may further include a second terminal. The second terminal is electrically connected to the first semiconductor element and protrudes from the sealing body. The second terminal may protrude from a second side surface located on a side opposite to the first side surface of the sealing body. On the first main surface of the sealing body, at least one second groove extending in a direction along the second side surface may be further provided in a range located between the first outer conductor layer and the second side surface.

In the semiconductor device according to the aspect of the disclosure, a width of the first terminal may be larger than a width of the second terminal. The number of the at least one first groove may be larger than the number of the at least one second groove.

In the semiconductor device according to the aspect of the disclosure, a width of the first terminal may be larger than a width of the second terminal. The depth of the at least one first groove may be larger than the depth of the at least one second groove.

In the semiconductor device according to the aspect of the disclosure, a width of the first terminal may be larger than a width of the second terminal. The number of the at least one first groove may be larger than the number of the at least one second groove. The depth of the at least one first groove may be larger than the depth of the at least one second groove.

The semiconductor device according to the aspect of the disclosure may further include a second heat dissipation plate. The second heat dissipation plate faces the first heat dissipation plate with the first semiconductor element interposed between the first heat dissipation plate and the second heat dissipation plate. The second heat dissipation plate may have a second insulating substrate, a second inner conductor layer, and a second outer conductor layer. The second inner conductor layer is located on the first side of the second insulating substrate and is electrically connected to the first semiconductor element. The second outer conductor layer is located on the second side of the second insulating substrate. The second outer conductor layer of the second heat dissipation plate may be exposed on a second main surface of the sealing body located on a side opposite to the first main surface. On the second main surface of the sealing body, at least one third groove extending in a direction along the first side surface may be provided in a range located between the second outer conductor layer of the second heat dissipation plate and the first side surface.

In the semiconductor device according to the aspect of the disclosure, the at least one third groove may include a plurality of third grooves, and a groove located closer to the first side surface among the third grooves may have a larger depth.

In the semiconductor device according to the aspect of the disclosure, on the second main surface of the sealing body, at least one fourth groove extending in a direction along the second side surface may be further provided in a range located between the second outer conductor layer and the second side surface.

In the semiconductor device according to the aspect of the disclosure, a width of the first terminal may be larger than a width of the second terminal. The number of the at least one third groove may be larger than the number of the at least one fourth groove.

In the semiconductor device according to the aspect of the disclosure, a width of the first terminal may be larger than a width of the second terminal. The depth of the at least one third groove may be larger than the depth of the at least one fourth groove.

In the semiconductor device according to the aspect of the disclosure, a width of the first terminal may be larger than a width of the second terminal. The number of the at least one third groove may be larger than the number of the at least one fourth groove. The depth of the at least one third groove may be larger than the depth of the at least one fourth groove.

The semiconductor device according to the aspect of the disclosure may further include a second heat dissipation plate. The second heat dissipation plate faces the first heat dissipation plate with the first semiconductor element interposed between the first heat dissipation plate and the second heat dissipation plate. The second heat dissipation plate may have a second insulating substrate, a second inner conductor layer, and a second outer conductor layer. The second inner conductor layer is located on a first side of the second insulating substrate and is electrically connected to the first semiconductor element. The second outer conductor layer is located on the second side of the second insulating substrate. The second outer conductor layer of the second heat dissipation plate may be exposed on a second main surface of the sealing body located on a side opposite to the first main surface. On the second main surface of the sealing body, at least one third groove extending in a direction along the first side surface may be provided in a range located between the second outer conductor layer of the second heat dissipation plate and the first side surface.

In the semiconductor device according to the aspect of the disclosure, the at least one third groove may include a plurality of third grooves, and a groove located closer to the first side surface among the third grooves may have a larger depth.

The semiconductor device according to the aspect of the disclosure may further include a second terminal. The second terminal is electrically connected to the first semiconductor element and protrudes from the sealing body. The second terminal may protrude from a second side surface located on a side opposite to the first side surface of the sealing body. On the second main surface of the sealing body, at least one fourth groove extending in a direction along the second side surface may be further provided in a range located between the second outer conductor layer and the second side surface.

In the semiconductor device according to the aspect of the disclosure, a width of the first terminal may be larger than a width of the second terminal. The number of the at least one third groove may be larger than the number of the at least one fourth groove.

In the semiconductor device according to the aspect of the disclosure, a width of the first terminal may be larger than a width of the second terminal, and the depth of the at least one third groove may be larger than the depth of the at least one fourth groove.

In the semiconductor device according to the aspect of the disclosure, a width of the first terminal may be larger than a width of the second terminal. The number of the at least one third groove may be larger than the number of the at least one fourth groove. The depth of the at least one third groove may be larger than the depth of the at least one fourth groove.

The semiconductor device according to the aspect of the disclosure may further include a second semiconductor element, a third heat dissipation plate, and a third terminal. The third heat dissipation plate is connected to the second semiconductor element and is held integrally with the second semiconductor element by the sealing body. The third terminal is electrically connected to the second semiconductor element and protrudes from the sealing body. The third heat dissipation plate may have a third insulating substrate, a third inner conductor layer, and a third outer conductor layer. The third inner conductor layer is located on the first side of the third insulating substrate and is electrically connected to the second semiconductor element. The third outer conductor layer is located on the second side of the third insulating substrate. The third outer conductor layer of the third heat dissipation plate may be exposed on the first main surface of the sealing body. The third terminal may protrude from the first side surface of the sealing body. The at least one first groove may extend to a range located between the third outer conductor layer of the third heat dissipation plate and the first side surface.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

A semiconductor device 10 of an embodiment will be described with reference to the diagrams. The semiconductor device 10 of the present embodiment can be used for electric power conversion circuits, such as converters and inverters, in electric vehicles, hybrid vehicles, fuel cell vehicles, and the like. However, the application of the semiconductor device 10 is not particularly limited. The semiconductor device 10 can be widely adopted for various devices and circuits.

Figure 1:
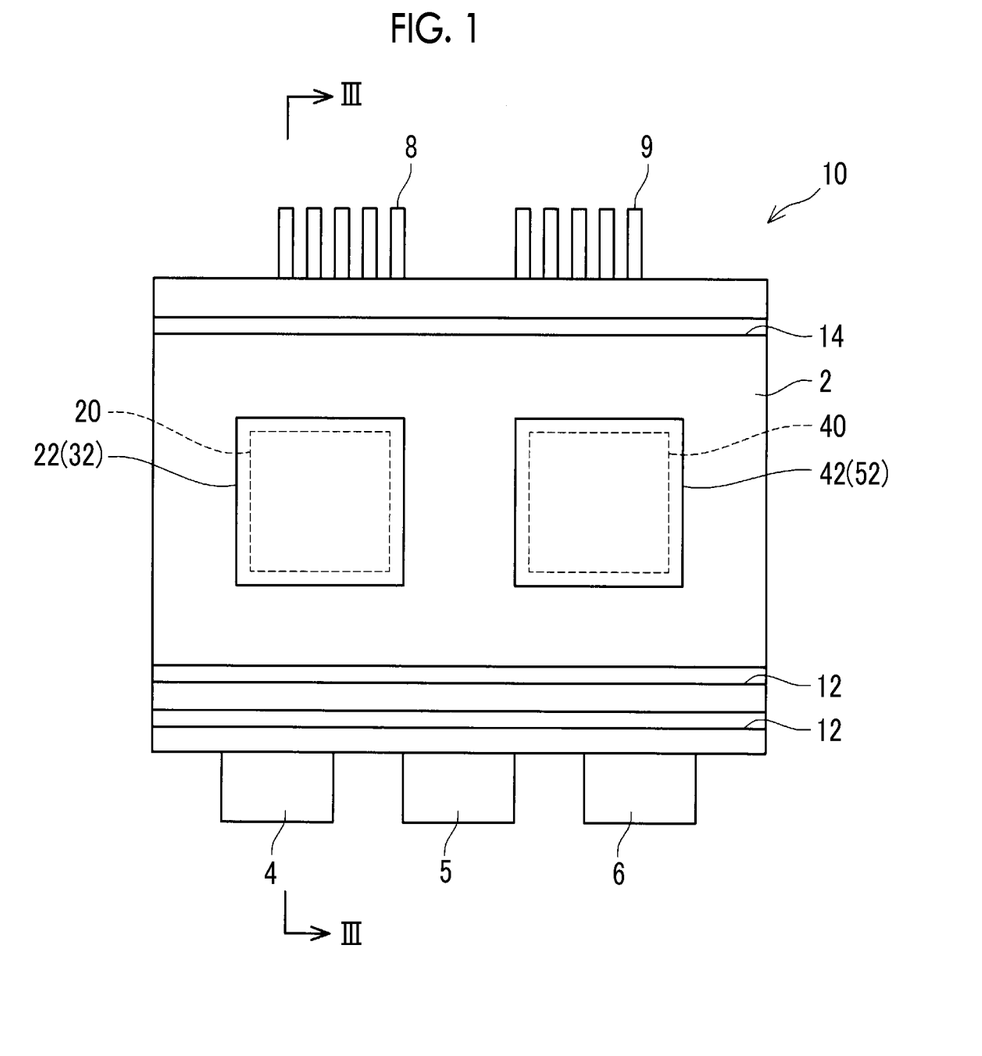
FIG. 1 is a plan view of a semiconductor device of an embodiment.
Figure 2:
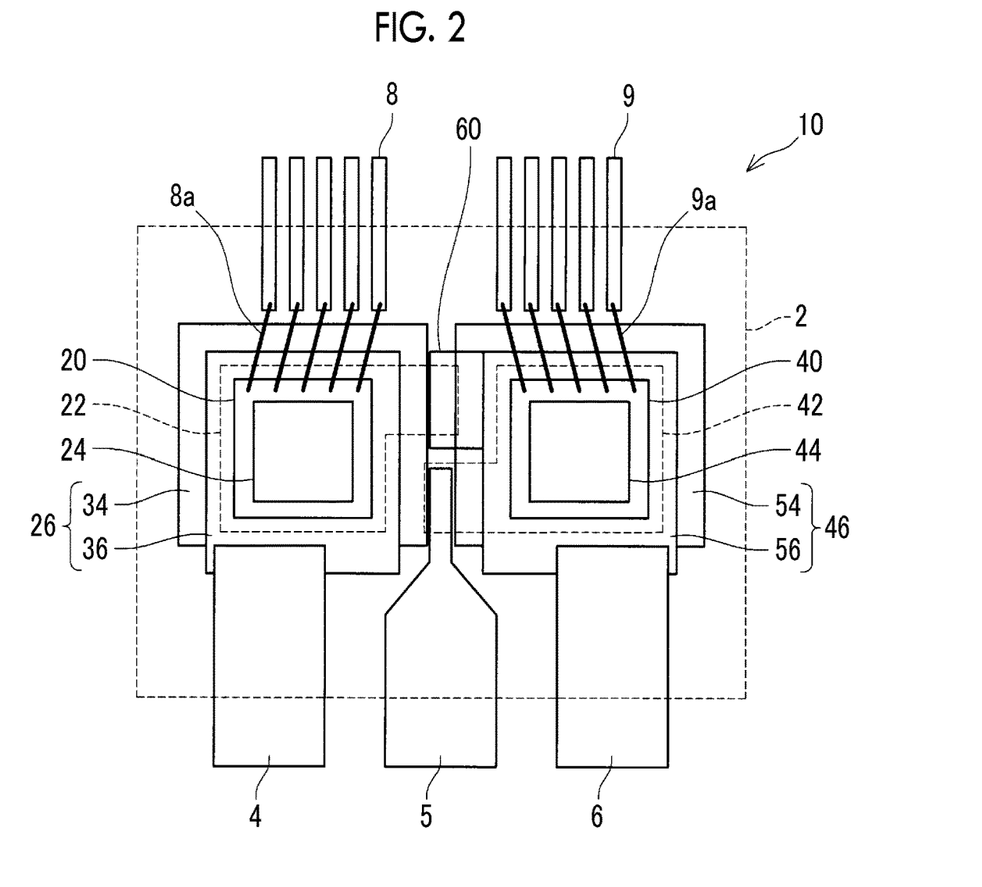
FIG. 2 shows an internal structure of the semiconductor device of the embodiment.
Figure 3:
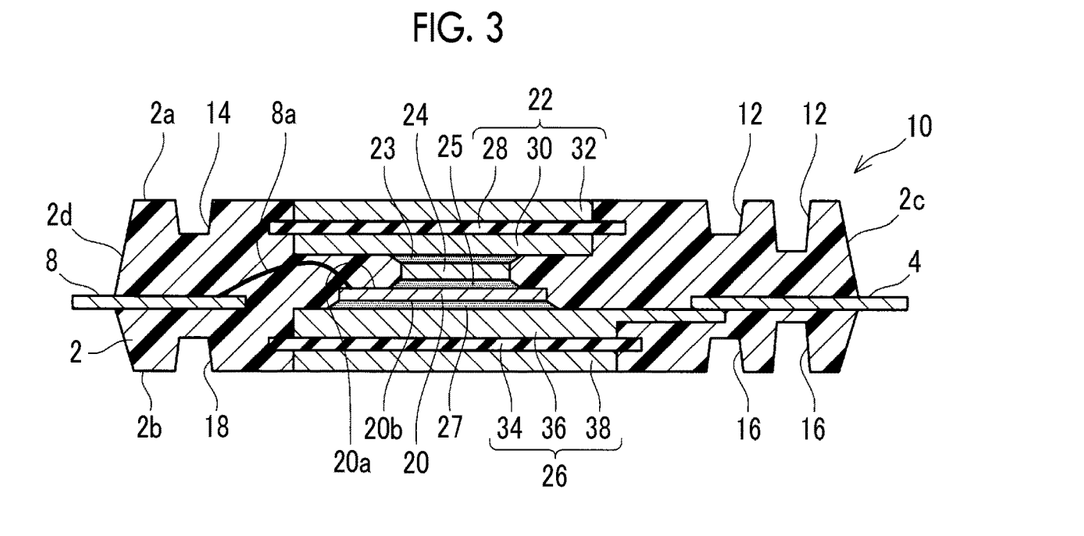
FIG. 3 is a sectional view taken along a line III-III in FIG. 1.

As shown in FIGS. 1 to 3, the semiconductor device 10 includes a first semiconductor element 20, a second semiconductor element 40, a sealing body 2, and a plurality of external connection terminals 4, 5, 6, 8, 9. The first semiconductor element 20 and the second semiconductor element 40 are sealed inside the sealing body 2. Although not particularly limited, the sealing body 2 is formed of, for example, a thermosetting resin, such as an epoxy resin. Each of the external connection terminals 4, 5, 6, 8, 9 extends from the outside to the inside of the sealing body 2, and is electrically connected to at least one of the first semiconductor element 20 and the second semiconductor element 40 in the sealing body 2. As an example, the external connection terminals 4, 5, 6, 8, 9 include a P-terminal 4, an N-terminal 5, and an O-terminal 6 that are terminals for electric power and a plurality of first signal terminals 8 and a plurality of second signal terminals 9 that are terminals for signals. Here, the P-terminal 4 is an example of a first terminal, and the O-terminal 6 is an example of a third terminal. The first signal terminal 8 is an example of a second terminal.

The first semiconductor element 20 has an upper surface electrode 20a and a lower surface electrode 20b. The upper surface electrode 20a is located on the upper surface of the first semiconductor element 20, and the lower surface electrode 20b is located on the lower surface of the first semiconductor element 20. The first semiconductor element 20 is a vertical semiconductor element having a pair of upper and lower electrodes 20a, 20b. Similarly, the second semiconductor element 40 has an upper surface electrode (not shown) and a lower surface electrode (not shown). The upper surface electrode is located on the upper surface of the second semiconductor element 40, and the lower surface electrode is located on the lower surface of the second semiconductor element 40. That is, the second semiconductor element 40 is also a vertical semiconductor element having a pair of upper and lower electrodes. In the present embodiment, the first semiconductor element 20 and the second semiconductor element 40 are semiconductor elements of the same type. More specifically, each of the first semiconductor element 20 and the second semiconductor element 40 is a reverse conducting IGBT (RC-IGBT) element having an insulated gate bipolar transistor (IGBT) and a diode.

However, each of the first semiconductor element 20 and the second semiconductor element 40 is not limited to the RC-IGBT element, and may be other power semiconductor elements, such as a metal-oxide-semiconductor field-effect transistor (MOSFET) element. Alternatively, each of the first semiconductor element 20 and the second semiconductor element 40 may be replaced with two or more semiconductor elements, such as a diode element and an IGBT element (or a MOSFET element). The specific configurations of the first semiconductor element 20 and the second semiconductor element 40 are not particularly limited, and various kinds of semiconductor elements can be adopted. In this case, the first semiconductor element 20 and the second semiconductor element 40 may be different types of semiconductor elements. Each of the first semiconductor element 20 and the second semiconductor element 40 can be formed using various kinds of semiconductor materials, such as silicon (Si), silicon carbide (SiC), and gallium nitride (GaN).

The semiconductor device 10 further includes a first heat dissipation plate 22, a first conductor spacer 24, and a second heat dissipation plate 26. The first heat dissipation plate 22 has an insulating substrate 28, an inner conductor layer 30 located on a first side of the insulating substrate 28 and electrically connected to the first semiconductor element 20, and an outer conductor layer 32 located on a second side of the insulating substrate 28. The inner conductor layer 30 and the outer conductor layer 32 of the first heat dissipation plate 22 are insulated from each other by the insulating substrate 28. The inner conductor layer 30 of the first heat dissipation plate 22 is electrically connected to the upper surface electrode 20a of the first semiconductor element 20 through the first conductor spacer 24. Although not particularly limited, soldering is adopted for the connection in the present embodiment. A solder layer 23 is formed between the first heat dissipation plate 22 and the first conductor spacer 24, and a solder layer 25 is formed between the first conductor spacer 24 and the first semiconductor element 20.

Similarly to the first heat dissipation plate 22, the second heat dissipation plate 26 has an insulating substrate 34, an inner conductor layer 36 located on a first side of the insulating substrate 34 and electrically connected to the first semiconductor element 20, and an outer conductor layer 38 located on a second side of the insulating substrate 34. The inner conductor layer 36 and the outer conductor layer 38 of the second heat dissipation plate 26 are insulated from each other by the insulating substrate 34. The inner conductor layer 36 of the second heat dissipation plate 26 is electrically connected to the lower surface electrode 20b of the first semiconductor element 20. Although not particularly limited, soldering is adopted for the connection in the present embodiment. Therefore, a solder layer 27 is formed between the first semiconductor element 20 and the second heat dissipation plate 26.

As an example, a direct bonded copper (DBC) substrate can be adopted as the first heat dissipation plate 22 or the second heat dissipation plate 26 in the present embodiment. The insulating substrates 28, 34 of the first heat dissipation plate 22 and the second heat dissipation plate 26 are formed of ceramic, such as aluminum oxide, silicon nitride, and aluminum nitride. The inner conductor layers 30, 36 and the outer conductor layers 32, 38 of the first heat dissipation plate 22 and the second heat dissipation plate 26 are formed of copper. However, each of the first heat dissipation plate 22 and the second heat dissipation plate 26 is not limited to the DBC substrate. As an example, each of the first heat dissipation plate 22 and the second heat dissipation plate 26 may be a direct bonded aluminum (DBA) substrate obtained by bonding high-purity aluminum onto both surfaces of the insulating substrates 28, 34 of the first heat dissipation plate 22 and the second heat dissipation plate 26. The insulating substrates 28, 34 of the first heat dissipation plate 22 and the second heat dissipation plate 26 are not limited to ceramic, and may be formed of other insulators. The inner conductor layers 30, 36 and the outer conductor layers 32, 38 of the first heat dissipation plate 22 and the second heat dissipation plate 26 are not limited to copper or aluminum, and may be formed of other metals. The bonding structure between the insulating substrate 28 and each of the conductor layers 30, 32 of the first heat dissipation plate 22 and the bonding structure between the insulating substrate 34 and each of the conductor layers 36, 38 of the second heat dissipation plate 26 are not particularly limited. As an example, the insulating substrate may be an active metal brazed copper (AMC) or an active metal brazed (AMB) substrate.

In the present embodiment, the first conductor spacer 24 is formed of copper. However, the first conductor spacer 24 is not limited to copper, and may be formed of other conductors, such as a copper alloy or other metals. Here, the first conductor spacer 24 is not necessarily needed, but a space at the time of connecting the first signal terminal 8 to the first semiconductor element 20 is secured.

The outer conductor layer 32 of the first heat dissipation plate 22 is exposed to a first main surface 2a located on the upper surface of the sealing body 2. Accordingly, the first heat dissipation plate 22 not only forms a part of the semiconductor device 10, but also functions as a heat dissipation plate that mainly dissipates the heat of the first semiconductor element 20 to the outside. Similarly, the outer conductor layer 38 of the second heat dissipation plate 26 is exposed to a second main surface 2b located on the lower surface of the sealing body 2. Accordingly, the second heat dissipation plate 26 not only forms a part of the electric circuit of the semiconductor device 10, but also functions as a heat dissipation plate that mainly dissipates the heat of the first semiconductor element 20 to the outside. As described above, the semiconductor device 10 of the present embodiment has a double-sided cooling structure in which the outer conductor layer 32 of the first heat dissipation plate 22 and the outer conductor layer 38 of the second heat dissipation plate 26 are exposed to both the surfaces 2a, 2b of the sealing body 2. However, the semiconductor device 10 is not limited to the double-sided cooling structure, and may have a single-sided cooling structure in which the outer conductor layer 32 of the first heat dissipation plate 22 or the outer conductor layer 38 of the second heat dissipation plate 26 is exposed from the sealing body 2.

The semiconductor device 10 further includes a third heat dissipation plate 42, a second conductor spacer 44, and a fourth heat dissipation plate 46. The third heat dissipation plate 42 has an insulating substrate (not shown), an inner conductor layer (not shown) located on the first side of the insulating substrate and electrically connected to the second semiconductor element 40, and an outer conductor layer 52 located on the second side of the insulating substrate. The inner conductor layer and the outer conductor layer 52 of the third heat dissipation plate 42 are insulated from each other by the insulating substrate. The inner conductor layer of the third heat dissipation plate 42 is electrically connected to an upper surface electrode (not shown) of the second semiconductor element 40 through the second conductor spacer 44. Although not particularly limited, soldering is adopted for the connection in the present embodiment. A solder layer (not shown) is formed between the third heat dissipation plate 42 and the second conductor spacer 44 and between the second conductor spacer 44 and the second semiconductor element 40.

Similarly to the third heat dissipation plate 42, the fourth heat dissipation plate 46 has an insulating substrate 54, an inner conductor layer 56 located on a first side of the insulating substrate 54 and electrically connected to the second semiconductor element 40, and an outer conductor layer (not shown) located on a second side of the insulating substrate 54. The inner conductor layer 56 and the outer conductor layer of the fourth heat dissipation plate 46 are insulated from each other by the insulating substrate 54. The inner conductor layer 56 of the fourth heat dissipation plate 46 is electrically connected to the lower surface electrode of the second semiconductor element 40. Although not particularly limited, soldering is adopted for the connection in the present embodiment. Therefore, a solder layer (not shown) is formed between the second semiconductor element 40 and the fourth heat dissipation plate 46.

As an example, a direct bonded copper (DBC) substrate can be adopted as the third heat dissipation plate 42 or the fourth heat dissipation plate 46 in the present embodiment. The insulating substrate of the third heat dissipation plate 42 and the insulating substrate 54 of the fourth heat dissipation plate 46 are formed of ceramic, such as aluminum oxide, silicon nitride, and aluminum nitride. The inner conductor layer of the third heat dissipation plate 42, the inner conductor layer 56 of the fourth heat dissipation plate 46, the outer conductor layer 52 of the third heat dissipation plate 42, and the outer conductor layer of the fourth heat dissipation plate 46 are formed of copper. However, each of the third heat dissipation plate 42 and the fourth heat dissipation plate 46 is not limited to the DBC substrate. As an example, each of the third heat dissipation plate 42 and the fourth heat dissipation plate 46 may be a direct bonded aluminum (DBA) substrate obtained by bonding high-purity aluminum onto both surfaces of the insulating substrate of the third heat dissipation plate 42, and the insulating substrate 54 of the fourth heat dissipation plate 46. The insulating substrate of the third heat dissipation plate 42 and the insulating substrate 54 of the fourth heat dissipation plate 46 are not limited to ceramic, and may be formed of other insulators. The inner conductor layer of the third heat dissipation plate 42, the inner conductor layer 56 of the fourth heat dissipation plate 46, the outer conductor layer 52 of the third heat dissipation plate 42, and the outer conductor layer of the fourth heat dissipation plate 46 are not limited to copper or aluminum, and may be formed of other metals. The bonding structure between the insulating substrate and the inner conductor layer and between the insulating substrate and the outer conductor layer 52 in the third heat dissipation plate 42 and the bonding structure between the insulating substrate 54 and the inner conductor layer 56 and between the insulating substrate 54 and the outer conductor layer in the fourth heat dissipation plate 46 are not particularly limited. As an example, the insulating substrate may be an active metal brazed copper (AMC) or an active metal brazed (AMB) substrate.

In the present embodiment, the second conductor spacer 44 is formed of copper. However, the second conductor spacer 44 is not limited to copper, and may be formed of other conductors, such as a copper alloy or other metals. Here, the second conductor spacer 44 is not necessarily needed, but a space at the time of connecting the second signal terminal 9 to the second semiconductor element 40 is secured.

The outer conductor layer 52 of the third heat dissipation plate 42 is exposed to the first main surface 2a located on the upper surface of the sealing body 2. Accordingly, the third heat dissipation plate 42 not only forms a part of the semiconductor device 10, but also functions as a heat dissipation plate that mainly dissipates the heat of the second semiconductor element 40 to the outside. Similarly, the outer conductor layer of the fourth heat dissipation plate 46 is exposed to the second main surface 2b located on the lower surface of the sealing body 2. Accordingly, the fourth heat dissipation plate 46 not only forms a part of the electric circuit of the semiconductor device 10, but also functions as a heat dissipation plate that mainly dissipates the heat of the second semiconductor element 40 to the outside. As described above, the semiconductor device 10 of the present embodiment has a double-sided cooling structure in which the outer conductor layer 52 of the third heat dissipation plate 42 and the outer conductor layer of the fourth heat dissipation plate 46 are exposed to both the surfaces 2a, 2b of the sealing body 2. However, the semiconductor device 10 is not limited to the double-sided cooling structure, and may have a single-sided cooling structure in which the outer conductor layer 52 of the third heat dissipation plate 42 or the outer conductor layer of the fourth heat dissipation plate 46 is exposed from the sealing body 2.

The semiconductor device 10 further has a joint 60 formed of a conductor. The joint 60 is located inside the sealing body 2, and as an example, electrically connects the inner conductor layer 30 of the first heat dissipation plate 22 and the inner conductor layer 56 of the fourth heat dissipation plate 46 to each other. Accordingly, the first semiconductor element 20 and the second semiconductor element 40 are connected in series to each other through the joint 60. The joint 60 of the present embodiment can be formed of, for example, copper. As an example, the joint 60 may be bonded to the inner conductor layer 30 of the first heat dissipation plate 22 by soldering and may be bonded to the inner conductor layer 56 of the fourth heat dissipation plate 46 by welding. However, the method of bonding the joint 60 to each of the inner conductor layers 30, 56 of the first heat dissipation plate 22 and the fourth heat dissipation plate 46 is not particularly limited.

As described above, the semiconductor device 10 includes the P-terminal 4, the N-terminal 5, and the O-terminal 6 as external connection terminals. The P-terminal the N-terminal 5, and the O-terminal 6 in the present embodiment are formed of copper. However, the P-terminal 4, the N-terminal 5, and the O-terminal 6 are not limited to copper, and may be formed of other conductors. The P-terminal 4 is bonded to the inner conductor layer 36 of the second heat dissipation plate 26 in the sealing body 2. The N-terminal 5 is bonded to the inner conductor layer of the third heat dissipation plate 42 in the sealing body 2. The O-terminal 6 is bonded to the inner conductor layer 56 of the fourth heat dissipation plate 46. As an example, the P-terminal 4 and the O-terminal 6 are bonded to the inner conductor layer 36 of the second heat dissipation plate 26 and the inner conductor layer 56 of the fourth heat dissipation plate 46, respectively, by welding. The semiconductor device 10 also includes the first signal terminals 8 and the second signal terminals 9 as external connection terminals. In the present embodiment, the first signal terminals 8 are connected to the first semiconductor element 20 by bonding wires 8a, and the second signal terminals 9 are connected to the second semiconductor element 40 by bonding wires 9a. The P-terminal 4, the N-terminal 5, and the O-terminal 6 protrude from a first side surface 2c adjacent to the first main surface 2a of the sealing body 2, and the signal terminals 8, 9 protrude from a second side surface 2d located on the side of the sealing body 2 opposite to the first side surface 2c.

In addition to the configuration described above, the semiconductor device 10 of the present embodiment is configured as follows. In the technique disclosed in this specification, the P-terminal 4, the first signal terminal 8, and the O-terminal 6 will be described as an example the first terminal, an example the second terminal, and an example the third terminal, respectively. As shown in FIG. 3, the P-terminal 4 protruding from the first side surface 2c of the sealing body 2 extends toward the first heat dissipation plate 22 in the sealing body 2. In a range where the P-terminal extends, the first heat dissipation plate 22 and the second heat dissipation plate 26 are not present. Accordingly, most of the range where the P-terminal extends is formed by the sealing body 2. For this reason, the amount of deformation due to a temperature change in the range where the P-terminal extends is larger than that in the other range where the heat dissipation plates 22, 26 are present. In this respect, on the first main surface 2a of the sealing body 2 in the semiconductor device 10 of the present embodiment, a first groove 12 extending in a direction along the first side surface 2c is provided in a range located between the outer conductor layer 32 of the first heat dissipation plate 22 and the first side surface 2c. According to such a configuration, in the above-described range where the first terminal extends, thermal deformation or thermal stress caused by the thermal deformation is reduced by the first groove 12 provided on the first main surface 2a. As a result, it is possible to suppress warping deformation occurring in the semiconductor device 10.

Although the number of first grooves 12 may be one, a plurality of first grooves 12 may be formed as in the present embodiment. In this case, the first grooves 12 may be formed such that the depth of each of the first grooves 12 becomes larger as the first groove 12 is located closer to the first side surface 2c. According to such a configuration, in the vicinity of the first side surface 2c where a relatively large stress is likely to occur, thermal deformation or thermal stress caused by the thermal deformation is sufficiently reduced. As a result, warping deformation occurring in the semiconductor device 10 is effectively suppressed.

Similarly, in the semiconductor device 10 of the present embodiment, the first signal terminal 8 protruding from the second side surface 2d of the sealing body 2 extends toward the first heat dissipation plate 22. In this case, on the first main surface 2a, a second groove 14 extending in a direction along the second side surface 2d may be provided in a range located between the outer conductor layer 32 of the first heat dissipation plate 22 and the second side surface 2d. Similarly to the first groove 12 with respect to the P-terminal 4, the second groove 14 is provided with respect to the first signal terminal 8. In this case, since the width of the P-terminal 4 is larger than the width of the first signal terminal 8, the rigidity of the P-terminal 4 is higher than the rigidity of the first signal terminal 8. In such a case, the number of first grooves 12 may be larger than the number of second grooves 14. Therefore, the rigidity of the sealing body 2 on the side of the P-terminal 4 is reduced, and the difference in stress, which occurs in the semiconductor device 10, between the side of the first signal terminal 8 and the side of the P-terminal 4 is reduced. As a result, warping deformation of the semiconductor device 10 is effectively suppressed.

As described above, since the width of the P-terminal 4 is larger than the width of the first signal terminal 8, the rigidity of the P-terminal 4 is higher than the rigidity of the first signal terminal 8. In this case, the depth of at least one first groove 12 may be set to be larger than the depth of at least one second groove 14. Even with such a configuration, the rigidity of the sealing body 2 on the side of the P-terminal 4 is reduced, and the difference in stress, which occurs in the semiconductor device 10, between the side of the first signal terminal 8 and the side of the P-terminal 4 is reduced. As a result, warping deformation of the semiconductor device 10 is suppressed.

As described above, the semiconductor device 10 of the present embodiment includes the second heat dissipation plate 26. In this case, similarly to the first main surface 2a, on the second main surface 2b, a third groove 16 extending in a direction along the first side surface 2c may be provided in a range located between the outer conductor layer 38 of the second heat dissipation plate 26 and the first side surface 2c. In this manner, similarly to the first groove 12, it is possible to suppress warping deformation occurring in the semiconductor device 10. A plurality of third grooves 16 may be provided. In this case, the third grooves 16 may be provided such that the depth of each of the third grooves 16 becomes larger as the third groove 16 is located closer to the first side surface 2c. According to such a configuration, in the vicinity of the first side surface 2c where a relatively large stress is likely to occur, thermal deformation or thermal stress caused by the thermal deformation is sufficiently reduced. As a result, warping deformation occurring in the semiconductor device 10 is effectively suppressed.

In the semiconductor device 10 of the present embodiment, similarly to the first main surface 2a, on the second main surface 2b, a fourth groove 18 extending in a direction along the second side surface 2d may be provided in a range located between the outer conductor layer 38 of the second heat dissipation plate 26 and the second side surface 2d. In this manner, similarly to the second groove 14, it is possible to suppress warping deformation occurring in the semiconductor device 10. In this case, since the width of the P-terminal 4 is larger than the width of the first signal terminal 8, the rigidity of the P-terminal 4 is higher than the rigidity of the first signal terminal 8. In such a case, the number of third grooves 16 may be larger than the number of fourth grooves 18. Therefore, the rigidity of the sealing body 2 on the side of the P-terminal 4 is reduced, and the difference in stress, which occurs in the semiconductor device 10, between the side of the first signal terminal 8 and the side of the P-terminal 4 is reduced. As a result, warping deformation of the semiconductor device 10 is effectively suppressed.

As described above, since the width of the P-terminal 4 is larger than the width of the first signal terminal 8, the rigidity of the P-terminal 4 is higher than the rigidity of the first signal terminal 8. In this case, the depth of at least one third groove 16 may be set to be larger than the depth of at least one fourth groove 18. Even with such a configuration, the rigidity of the sealing body 2 on the side of the P-terminal 4 is reduced, and the difference in stress, which occurs in the semiconductor device 10, between the side of the first signal terminal 8 and the side of the P-terminal 4 is reduced. As a result, warping deformation of the semiconductor device 10 is suppressed.

The semiconductor device 10 of the present embodiment also includes the third heat dissipation plate 42 and the fourth heat dissipation plate 46. The O-terminal 6 protruding from the first side surface 2c of the sealing body 2 extends toward the third heat dissipation plate 42 and the fourth heat dissipation plate 46, and the second signal terminal 9 protruding from the second side surface 2d of the sealing body 2 extends toward the third heat dissipation plate 42 and the fourth heat dissipation plate 46. In such a configuration, the first groove 12 may extend to a range located between the outer conductor layer 52 of the third heat dissipation plate 42 and the first side surface 2c, and the second groove 14 may extend to a range located between the outer conductor layer 52 of the third heat dissipation plate 42 and the second side surface 2d. Similarly, the third groove 16 may extend to a range located between the outer conductor layer of the fourth heat dissipation plate 46 and the first side surface 2c, and the fourth groove 18 may extend to a range located between the outer conductor layer of the fourth heat dissipation plate 46 and the second side surface 2d.

In the present embodiment, the semiconductor device 10 includes two semiconductor elements of the first semiconductor element 20 and the second semiconductor element 40. However, the number of semiconductor elements is not particularly limited, and the semiconductor device 10 may include one or three or more semiconductor elements. In the semiconductor device 10, each of the first heat dissipation plate 22 and the third heat dissipation plate 42 has a separate insulating substrate. However, the structure of the heat dissipation plate described above is not particularly limited. For example, the semiconductor device 10 may have a structure in which the insulating substrates of the first heat dissipation plate 22 and the third heat dissipation plate 42 are integrated. However, in a case where the insulating substrates are integrated, non-uniform thermal expansion may occur between the sealing body 2 and each of the heat dissipation plates 22, 42. In this respect, the structure of the present embodiment is more excellent. The second heat dissipation plate 26 and the fourth heat dissipation plate 46 are also the same as described above.

Figure 4:
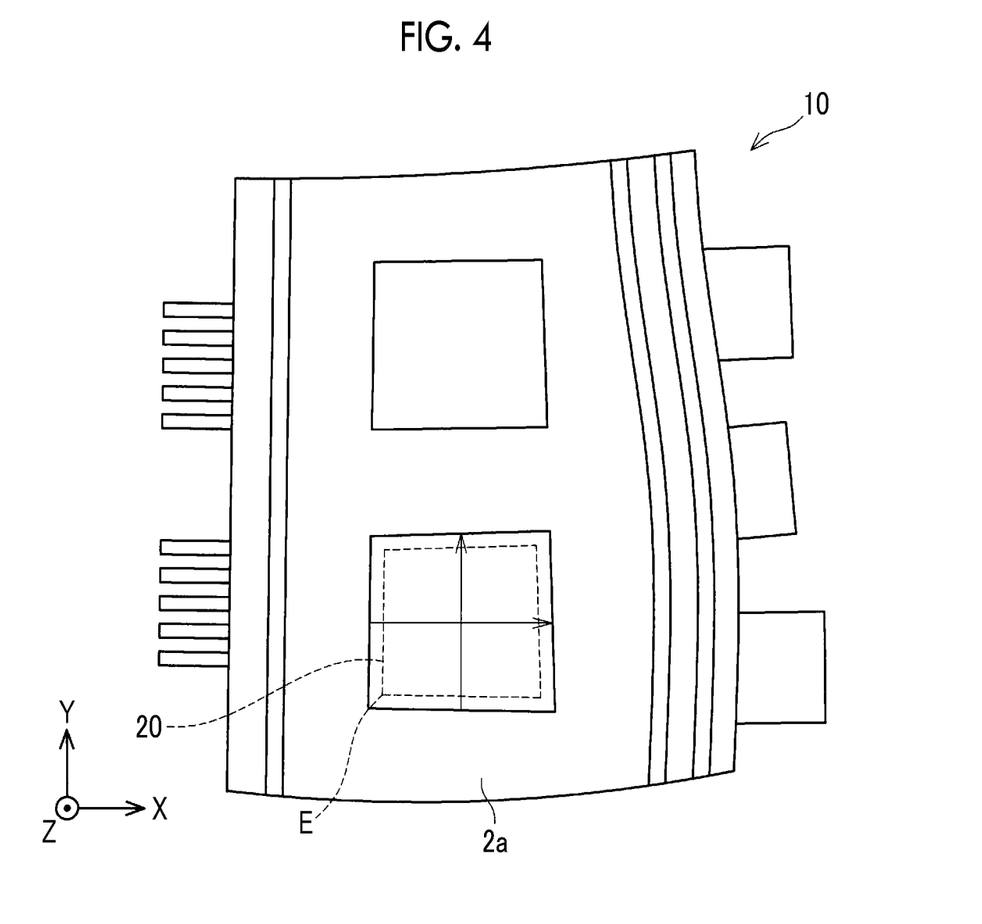
FIG. 4 shows a state in which the semiconductor device is thermally deformed by a power cycle.
Figure 5:
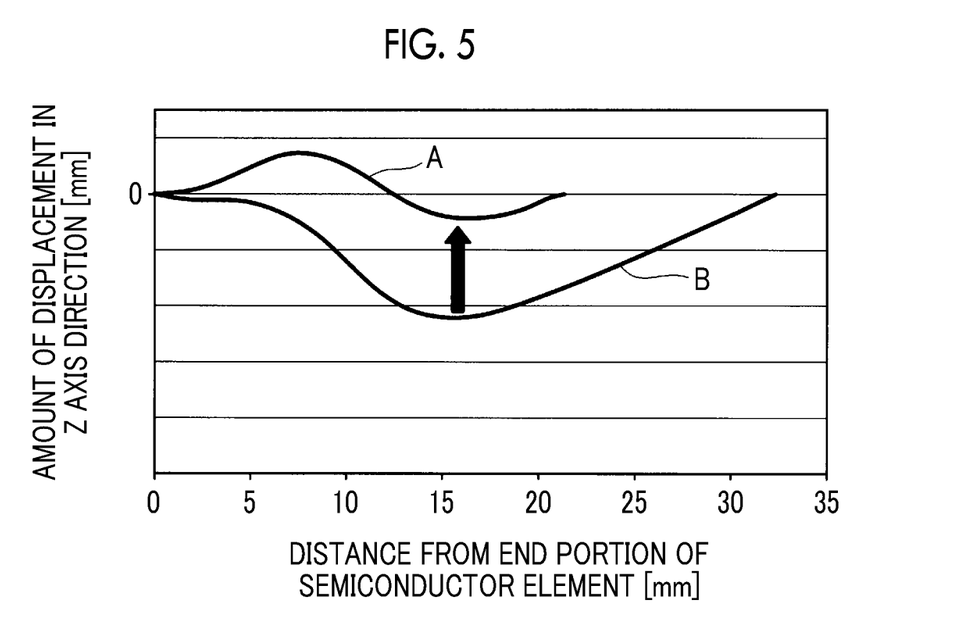
FIG. 5 is a graph showing the amount of displacement in the Z axis direction with respect to the distance in the X axis direction from an end portion of a semiconductor element on a first main surface of the semiconductor device in FIG. 4.
Figure 6:
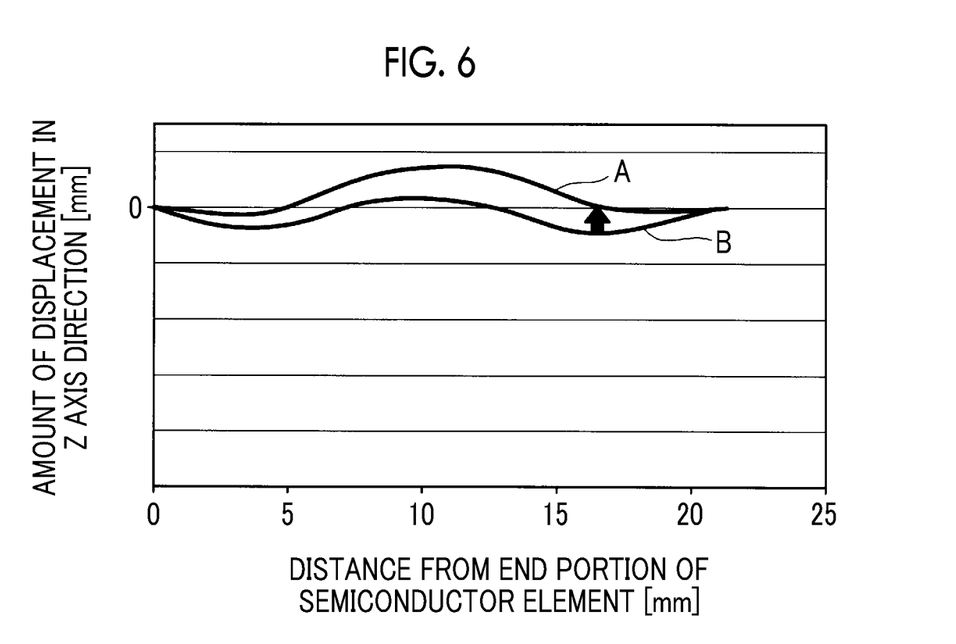
FIG. 6 is a graph showing the amount of displacement in the Z axis direction with respect to the distance in the Y axis direction from the end portion of the semiconductor element on the first main surface of the semiconductor device in FIG. 4.
Figure 7:
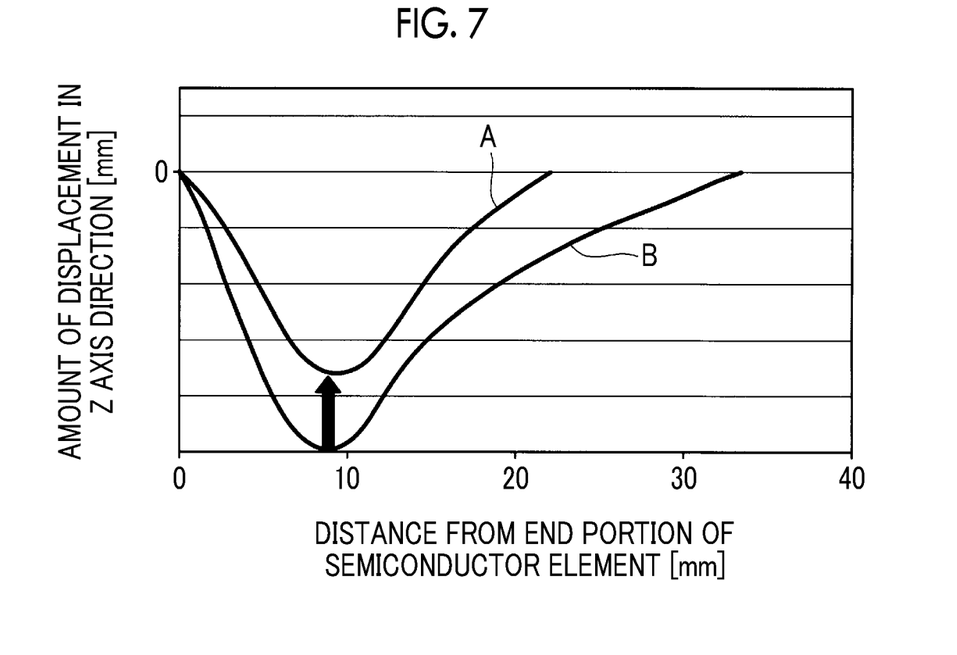
FIG. 7 is a graph showing the amount of displacement in the Z axis direction with respect to the distance in the X axis direction from the end portion of the semiconductor element on a second main surface of the semiconductor device in FIG. 4.
Figure 8:
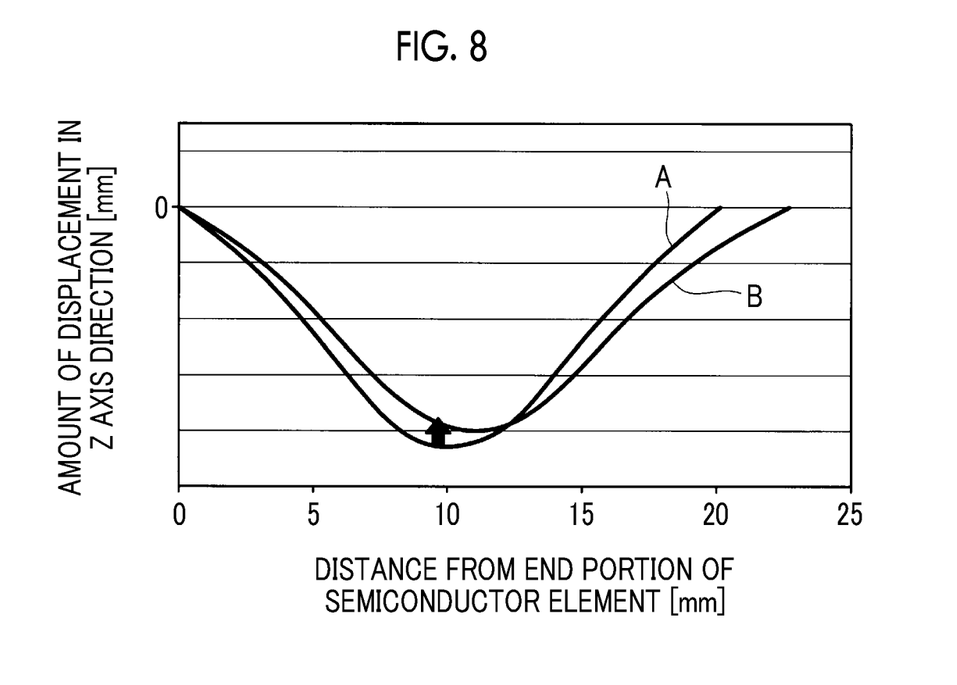
FIG. 8 is a graph showing the amount of displacement in the Z axis direction with respect to the distance in the Y axis direction from the end portion of the semiconductor element on the second main surface of the semiconductor device in FIG. 4.

Next, a result obtained by calculating the displacement amount of warping deformation occurring in the semiconductor device 10 by computer aided engineering (CAE) analysis is shown. In the semiconductor device 10, the power cycle of repeating power application and stopping thereof is repeated several times. That is, in the case of the internal temperature of the semiconductor device 10, a temperature change from a low temperature to a high temperature is repeated. As understood from FIG. 4, after several power cycles, displacement in the Z axis direction due to thermal stress occurs in the X axis direction and the Y axis direction in the semiconductor device 10. In FIG. 4, warping deformation occurring in the semiconductor device 10 is shown in an exaggerated manner. FIGS. 5 and 6 show, in the warping deformation of the semiconductor device 10, the amount of displacement in the Z axis direction with respect to distances in the X axis direction and the Y axis direction from an end portion F of the first semiconductor element 20 on the first main surface 2a in FIG. 4. Similarly, FIGS. 7 and 8 show, in the warping deformation of the semiconductor device 10, the amount of displacement in the Z axis direction with respect to distances in the X axis direction and the Y axis direction from the end portion F of the first semiconductor element 20 on the second main surface 2b located on a side opposite to the first main surface 2a in FIG. 4. FIGS. 5 to 8 also show data of a semiconductor device having a known structure as a comparative example. As the semiconductor device having a known structure, a semiconductor device having a structure in which a heat dissipation plate not having an insulating substrate is provided and no groove is provided on the main surface of a sealing body is adopted. In FIGS. 5 to 8, A shows data of the semiconductor device 10 in the present embodiment, and B shows data of the semiconductor device having a known structure. In both cases of the first main surface side and the second main surface side, the amount of displacement in the Z axis direction in the semiconductor device 10 of the present embodiment is smaller than that in the known structure. From the above, it can be understood that the application of the technique disclosed in this specification suppresses warping deformation occurring during use of the semiconductor device 10.

As another method for improving the flatness of the heat dissipation plate of the semiconductor device at the time of manufacturing the semiconductor device, it is also conceivable to perform, for example, cutting of the heat dissipation surface of the semiconductor device after a step of molding the sealing body. In this case, the portion of the sealing body of the semiconductor device is fixed with a fixing tool, such as a chuck, to perform processing. However, at the time of detaching the semiconductor device from the fixing tool, elastic deformation or the like occurs. As a result, warping deformation may occur in the semiconductor device. Also in the case of the warping deformation at the time of such manufacturing, the warping deformation of the semiconductor device 10 can be suppressed by applying the technique disclosed in this specification.

While some specific examples have been described in detail above, these are merely illustrative and do not limit the scope of the claims. The techniques described in the claims include various changes and modifications of the specific examples exemplified above. The technical elements described in this specification or the diagrams exhibit technical usefulness individually or in various combinations.

What is claimed is:

1. A semiconductor device comprising:
a first semiconductor element;
a first heat dissipation plate connected to the first semiconductor element;
a sealing body that integrally holds the first semiconductor element and the first heat dissipation plate; and
a first terminal that is electrically connected to the first semiconductor element and protrudes from the sealing body, wherein:
the first heat dissipation plate has
a first insulating substrate,
a first inner conductor layer that is located on a first side of the first insulating substrate and is electrically connected to the first semiconductor element, and
a first outer conductor layer that is located on a second side of the first insulating substrate;
the first outer conductor layer is exposed on a first main surface of the sealing body;
the first terminal protrudes from a first side surface adjacent to the first main surface of the sealing body;
on the first main surface of the sealing body, at least one first groove extending in a direction along the first side surface is provided in a range located between the first outer conductor layer and the first side surface;
wherein the at least one first groove includes a plurality of first grooves; and
a groove located closer to the first side surface among the first grooves has a larger depth.

2. The semiconductor device according to claim 1, further comprising a second terminal that is electrically connected to the first semiconductor element and protrudes from the sealing body, wherein:
the second terminal protrudes from a second side surface located on a side opposite to the first side surface of the sealing body; and
on the first main surface of the sealing body, at least one second groove extending in a direction along the second side surface is further provided in a range located between the first outer conductor layer and the second side surface.

3. The semiconductor device according to claim 2, wherein:
a width of the first terminal is larger than a width of the second terminal; and
the number of the at least one first groove is larger than the number of the at least one second groove.

4. The semiconductor device according to claim 2, wherein:
a width of the first terminal is larger than a width of the second terminal; and
a depth of the at least one first groove is larger than a depth of the at least one second groove.

5. The semiconductor device according to claim 2, wherein:
a width of the first terminal is larger than a width of the second terminal;
the number of the at least one first groove is larger than the number of the at least one second groove; and
a depth of the at least one first groove is larger than a depth of the at least one second groove.

6. The semiconductor device according to claim 2, further comprising a second heat dissipation plate that faces the first heat dissipation plate with the first semiconductor element interposed between the first heat dissipation plate and the second heat dissipation plate, wherein:
the second heat dissipation plate has
a second insulating substrate,
a second inner conductor layer that is located on a first side of the second insulating substrate and is electrically connected to the first semiconductor element, and
a second outer conductor layer that is located on a second side of the second insulating substrate;
the second outer conductor layer of the second heat dissipation plate is exposed on a second main surface of the sealing body located on a side opposite to the first main surface; and
on the second main surface of the sealing body, at least one third groove extending in a direction along the first side surface is provided in a range located between the second outer conductor layer of the second heat dissipation plate and the first side surface.

7. The semiconductor device according to claim 6, wherein:
the at least one third groove includes a plurality of third grooves; and
a groove located closer to the first side surface among the third grooves has a larger depth.

8. The semiconductor device according to claim 6, wherein, on the second main surface of the sealing body, at least one fourth groove extending in a direction along the second side surface is further provided in a range located between the second outer conductor layer and the second side surface.

9. The semiconductor device according to claim 8, wherein:
   a width of the first terminal is larger than a width of the second terminal; and
   the number of the at least one third groove is larger than the number of the at least one fourth groove.

10. The semiconductor device according to claim 8, wherein:
    a width of the first terminal is larger than a width of the second terminal; and
    a depth of the at least one third groove is larger than a depth of the at least one fourth groove.

11. The semiconductor device according to claim 8, wherein:
    a width of the first terminal is larger than a width of the second terminal;
    the number of the at least one third groove is larger than the number of the at least one fourth groove; and
    a depth of the at least one third groove is larger than a depth of the at least one fourth groove.

12. The semiconductor device according to claim 1, further comprising a second heat dissipation plate that faces the first heat dissipation plate with the first semiconductor element interposed between the first heat dissipation plate and the second heat dissipation plate, wherein:
    the second heat dissipation plate has
      a second insulating substrate,
      a second inner conductor layer that is located on a first side of the second insulating substrate and is electrically connected to the first semiconductor element, and
      a second outer conductor layer that is located on a second side of the second insulating substrate;
    the second outer conductor layer of the second heat dissipation plate is exposed on a second main surface of the sealing body located on a side opposite to the first main surface; and
    on the second main surface of the sealing body, at least one groove extending in a direction along the first side surface is provided in a range located between the second outer conductor layer of the second heat dissipation plate and the first side surface.

13. The semiconductor device according to claim 12, wherein:
    the at least one groove includes a plurality of grooves; and
    a groove located closer to the first side surface among the grooves has a larger depth.

14. The semiconductor device according to claim 12, further comprising a second terminal that is electrically connected to the first semiconductor element and protrudes from the sealing body, wherein:
    the second terminal protrudes from a second side surface located on a side opposite to the first side surface of the sealing body; and
    on the second main surface of the sealing body, at least one fourth groove extending in a direction along the second side surface is further provided in a range located between the second outer conductor layer and the second side surface.

15. The semiconductor device according to claim 14, wherein:
    a width of the first terminal is larger than a width of the second terminal; and the number of the at least one third groove is larger than the number of the at least one fourth groove.

16. The semiconductor device according to claim 14, wherein:
    a width of the first terminal is larger than a width of the second terminal; and
    a depth of the at least one third groove is larger than a depth of the at least one fourth groove.

17. The semiconductor device according to claim 14, wherein:
    a width of the first terminal is larger than a width of the second terminal;
    the number of the at least one third groove is larger than the number of the at least one fourth groove; and
    a depth of the at least one third groove is larger than a depth of the at least one fourth groove.

18. The semiconductor device according to claim 1, further comprising:
    a second semiconductor element;
    a heat dissipation plate that is connected to the second semiconductor element and is held integrally with the second semiconductor element by the sealing body; and
    a terminal that is electrically connected to the second semiconductor element and protrudes from the sealing body, wherein:
    the heat dissipation plate has
      an insulating substrate,
      an inner conductor layer that is located on a first side of the insulating substrate and is electrically connected to the second semiconductor element, and
      an outer conductor layer that is located on a second side of the insulating substrate;
    the outer conductor layer of the heat dissipation plate is exposed on the first main surface of the sealing body;
    the terminal protrudes from the first side surface of the sealing body; and
    the at least one first groove extends to a range located between the outer conductor layer of the heat dissipation plate and the first side surface.

19. A semiconductor device comprising:
    a first semiconductor element;
    a first heat dissipation plate connected to the first semiconductor element;
    a sealing body that integrally holds the first semiconductor element and the first heat dissipation plate;
    a first terminal that is electrically connected to the first semiconductor element and protrudes from the sealing body; and
    a second terminal that is electrically connected to the first semiconductor element and protrudes from the sealing body, wherein:
    the first heat dissipation plate has
      a first insulating substrate,
      a first inner conductor layer that is located on a first side of the first insulating substrate and is electrically connected to the first semiconductor element, and
      a first outer conductor layer that is located on a second side of the first insulating substrate;
    the first outer conductor layer is exposed on a first main surface of the sealing body;
    the first terminal protrudes from a first side surface adjacent to the first main surface of the sealing body;
    the second terminal protrudes from a second side surface located on a side opposite to the first side surface of the sealing body;
    on the first main surface of the sealing body, at least one first groove extending in a direction along the first side surface is provided in a range located between the first outer conductor layer and the first side surface, and at least one second groove extending in a direction along the second side surface is further provided in a range located between the first outer conductor layer and the second side surface;

a width of the first terminal is larger than a width of the second terminal; and the number of the at least one first groove is larger than the number of the at least one second groove.

20. A semiconductor device comprising:

a first semiconductor element;

a first heat dissipation plate connected to the first semiconductor element;

a sealing body that integrally holds the first semiconductor element and the first heat dissipation plate;

a first terminal that is electrically connected to the first semiconductor element and protrudes from the sealing body; and a second heat dissipation plate that faces the first heat dissipation plate with the first semiconductor element interposed between the first heat dissipation plate and the second heat dissipation plate, wherein:

the first heat dissipation plate has a first insulating substrate, a first inner conductor layer that is located on a first side of the first insulating substrate and is electrically connected to the first semiconductor element, and a first outer conductor layer that is located on a second side of the first insulating substrate;

the first outer conductor layer is exposed on a first main surface of the sealing body;

the first terminal protrudes from a first side surface adjacent to the first main surface of the sealing body;

the second heat dissipation plate has a second insulating substrate, a second inner conductor layer that is located on a first side of the second insulating substrate and is electrically connected to the first semiconductor element, and a second outer conductor layer that is located on a second side of the second insulating substrate;

the second outer conductor layer of the second heat dissipation plate is exposed on a second main surface of the sealing body located on a side opposite to the first main surface;

on the first main surface of the sealing body, at least one first groove extending in a direction along the first side surface is provided in a range located between the first outer conductor layer and the first side surface;

on the second main surface of the sealing body, at least one groove extending in a direction along the first side surface is provided in a range located between the second outer conductor layer of the second heat dissipation plate and the first side surface;

the at least one groove includes a plurality of grooves; and a groove located closer to the first side surface among the grooves has a larger depth.

* * * * *